(12) United States Patent
Hol et al.

(10) Patent No.: US 6,267,935 B1
(45) Date of Patent: Jul. 31, 2001

(54) CRYSTALLIZATION MEDIA

(75) Inventors: Wim G. J. Hol, Kenmore, WA (US); Steven H. Sarfaty, Belleville, IL (US); Lansing J. Stewart; Hidong Kim, both of Bainbridge Island, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 09/344,007

(22) Filed: Jun. 25, 1999

Related U.S. Application Data (60) Provisional application No. 60/090,812, filed on Jun. 26, 1998, and provisional application No. 60/090,811, filed on Jun. 26, 1998.

(51) Int. Cl.$^7$ .............................. B09D 9/00; G01N 31/00
(52) U.S. Cl. ............................................ 422/245.1; 436/4
(58) Field of Search .................................. 117/206, 927; 422/245.1, 215, 256; 436/4, 15

(56) References Cited

U.S. PATENT DOCUMENTS

| 5,130,105 | * | 7/1992 | Carter et al. ......................... 422/215 |
| 6,093,573 | * | 7/2000 | Beamer et al. ........................ 436/86 |

OTHER PUBLICATIONS

Screening Kits: Product Information Sheets, 2 pp., Downloaded Sep. 21, 1999 from Hampton Research Website www.hamptonresearch.com/211x.html.

Hampton Research Solutions for Crystal Growth, Crystal Screen Reagent Formulations, Listing, 3 pp., Downloaded Sep. 21, 1999 from Hampton Research Website www.hamptonresearch.com/2110rw.html.

Hampton Research Solutions for Crystal Growth, Crystal Screen 2 Reagent Formulations, Listing, 3 pp., Downloaded Sep. 21, 1999 from Hampton Research Website ww.hamptonresearch.com/2112rw.html.

Hampton Research Solutions for Crystal Growth, Crystal Screen Cryo Reagent Formulations, Listing, 3 pp., Downloaded Sep. 21, 1999 from Hampton Research Website www.hamptonresearch.com/2122rw.html.

Hampton Research Solutions for Crystal Growth, Crystal Screen Lite Reagent Formulations, Listing, 3 pp., Downloaded Sep. 21, 1999 from Hampton Research Website www.hamptonresearch.com/2128rw.html.

* cited by examiner

*Primary Examiner*—William Powell
(74) *Attorney, Agent, or Firm*—Christensen O'Connor Johnson Kindness PLLC (57) ABSTRACT

In one aspect, the present invention provides crystallization solutions useful for crystallizing proteins and other molecules, especially macromolecules. In a presently preferred embodiment, the crystallization solutions of the invention are combined as four crystallization solution sets. Each of the four crystallization solution sets includes forty eight different crystallization solutions. Each individual crystallization solution includes a precipitant and a buffer, and optionally includes at least one additive. In another aspect, the present invention provides kits including a plurality of crystallization solutions of the present invention and at least one crystallization plate that preferably includes a plurality of reservoirs. Preferably the crystallization solutions are disposed within the reservoirs of the crystallization plates.

24 Claims, 1 Drawing Sheet

SEQUENCE LISTING

<160> NUMBER OF SEQ ID NOS: 2

<210> SEQ ID NO 1
<211> LENGTH: 22
<212> TYPE: DNA
<213> ORGANISM: Artificial Sequence
<220> FEATURE:
<223> OTHER INFORMATION: Description of Artificial Sequence:
      oligonucleotide
<220> FEATURE:
<221> NAME/KEY: misc_feature
<222> LOCATION: (1)..(22)
<223> OTHER INFORMATION: 5' to 3' strand of synthetic oligonucleotide
      cocrystallized with human topoisomerase I

<400> SEQUENCE: 1
aaaaagactt agaaaaattt tt                                              22

<210> SEQ ID NO 2
<211> LENGTH: 22
<212> TYPE: DNA
<213> ORGANISM: Artificial Sequence
<220> FEATURE:
<223> OTHER INFORMATION: Description of Artificial Sequence:
      oligonucleotide
<220> FEATURE:
<221> NAME/KEY: misc_feature
<222> LOCATION: (1)..(22)
<223> OTHER INFORMATION: 3' to 5'  strand of synthetic oligonucleotide
      cocrystallized with human topoisomerase I

<400> SEQUENCE: 2 ttttctgaa tctttttaaa aa                                               22

CRYSTALLIZATION MEDIA

RELATED APPLICATIONS

This application claims benefit of priority from U.S. patent application Ser. No. 09/150,629 filed on Sep. 9, 1998, and issued Mar. 21, 2000, as U.S. Pat. No. 6,039,804, and from U.S. provisional patent application Ser. Nos. 60/090,812 and 60/090,811, both of which were filed on Jun. 26, 1998.

FIELD OF THE INVENTION

The present invention relates to solutions that are useful in the crystallization of molecules, especially macromolecules such as proteins.

BACKGROUND OF THE INVENTION

Macromolecular X-ray crystallography is an essential tool in modern drug discovery and molecular biology. Using X-ray crystallographic techniques, the three-dimensional structures of biological macromolecules, such as proteins, nucleic acids, and their various complexes, can be determined at practically atomic-level resolution from X-ray diffraction data.

One of the first and most important steps in the X-ray crystal structure determination of a target macromolecule is to grow large, well-diffracting crystals of the macromolecule. As the techniques for collecting and analyzing X-ray diffraction data have become more rapid and automated, crystal growth has become a rate-limiting step in the structure determination process.

Vapor diffusion is the most widely used technique for crystallization in modern macromolecular X-ray crystallography. In this technique, a small volume of the macromolecule sample is mixed with an approximately equal volume of a crystallization solution. The resulting drop of liquid (containing macromolecule and dilute crystallization solution) is sealed in a chamber with a much larger reservoir volume of the crystallization solution. The drop is kept separate from the reservoir of crystallization solvent either by hanging the drop from a glass cover slip or by sitting the drop on a pedestal above the level of the solvent in the reservoir. Over time, the crystallization drop and the reservoir solutions equilibrate via vapor diffusion of volatile chemical species. Supersaturating concentrations of the macromolecule are achieved, resulting in crystallization of the macromolecule sample in the drop.

The process of growing biological macromolecule crystals remains, however, a highly empirical process. Macromolecular crystallization is dependent on a host of experimental parameters, including; pH, temperature, the concentration of salts in the crystallization drop, the concentration of the macromolecule to be crystallized, and the concentration of the precipitating agent (of which there are hundreds). In particular, the choice of solute conditions in which to grow crystals continues to be a matter for empirical determination. Consequently, the ability to rapidly and easily generate many crystallization trials is important in determining the ideal conditions for crystallization. Thus, there is a need for sets of preformulated crystallization solutions that can be used to rapidly and easily generate many crystallization trials.

SUMMARY OF THE INVENTION

In one aspect, the present invention provides solutions (hereinafter referred to as crystallization solutions) useful for crystallizing proteins and other molecules, especially macromolecules. In a presently preferred embodiment, the crystallization solutions of the invention are combined as four crystallization solution sets (identified herein as Crystallization Solution Set I, Crystallization Solution Set II, Crystallization Solution Set III and Crystallization Solution Set IV). Each of the four crystallization solution sets includes forty eight different crystallization solutions. Each individual crystallization solution includes a precipitant and a buffer, and optionally includes at least one additive as set forth more fully herein. The compositions of the individual solutions that constitute Crystallization Solution Set I, Crystallization Solution Set II, Crystallization Solution Set III and Crystallization Solution Set IV are set forth in Table I, Table II, Table III and Table IV, respectively. Thus, in one aspect, the present invention is directed to sets of crystallization solutions including the solutions of one or more of Crystallization Solution Set I, Crystallization Solution Set II, Crystallization Solution Set III and Crystallization Solution Set IV.

In another embodiment, the present invention provides subsets of the crystallization solutions of Crystallization Solution Set I, Crystallization Solution Set II, Crystallization Solution Set III and Crystallization Solution Set IV which are useful to determine crystallization conditions for a wide variety of molecules, especially biological macromolecules. While any subset of crystallization solutions of Crystallization Solution Set L Crystallization Solution Set II, Crystallization Solution Set III and Crystallization Solution Set IV can be utilized, presently preferred crystallization solution subsets are: subset I, solution numbers 1, 9, 10 and 28 of Crystallization Solution Set I; subset II, solution numbers 1, 8, 14, 26, 30 and 34 of Crystallization Solution Set II; subset III, solution numbers 2, 11, 18, 25, 26, 28, 29, 31, 38, 41 and 46 of Crystallization Solution Set III; and subset IV, solution numbers 2, 3, 5, 6, 7, 8, 17, 22, 24, 32, 34, 37, 43 and 48 of Crystallization Solution Set IV. Thus, crystallization solution subsets preferably include at least one of subset I, subset II, subset III and subset IV. As described more fully herein, the foregoing, presently preferred subsets have been successfully used to crystallize several proteins, including proteins considered recalcitrant to crystallization.

In another aspect, the present invention provides kits including a plurality of crystallization solutions of the present invention and at least one crystallization plate that preferably includes a plurality of reservoirs. Preferably the crystallization solutions of the crystallization solution set(s) are disposed within the reservoirs of the crystallization plates. The presently preferred crystallization plates are disclosed in copending U.S. patent application Ser. No. 09/150,629, issued on Mar. 21, 2000 as U.S. Pat. No. 6,039,804 incorporated herein by reference. In a presently preferred embodiment, the present invention provides kits including at least one crystallization plate and a set of crystallization solutions selected from the group of sets consisting of Crystallization Solution Set I, Crystallization Solution Set II, Crystallization Solution Set III and Crystallization Solution Set IV. In another presently preferred embodiment, the present invention provides kits including at least one crystallization plate and including a subset of crystallization solutions selected from the group of subsets consisting of: subset I, solution numbers 1, 9, 10 and 28 of Crystallization Solution Set I; subset II, solution numbers 1, 8, 14, 26, 30 and 34 of Crystallization Solution Set II; subset III, solution numbers 2, 11, 18, 25, 26, 28, 29, 31, 38, 41 and 46 of Crystallization Solution Set III; and subset IV, solution numbers 2, 3, 5, 6, 7, 8, 17, 22, 24, 32, 34, 37, 43 and 48 of Crystallization Solution Set IV.

Thus, the present invention provides solutions and kits that permit a large number of crystallization conditions to be easily and simultaneously tested in order to identify crystallization conditions under which a target molecule, especially a biological macromolecule such as a protein, can be crystallized. As discussed more fully herein, the crystallization solutions of the present invention have been successfully used to crystallize proteins regarded as recalcitrant to crystallization.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In one aspect, the present invention provides crystallization solutions useful for crystallizing proteins and other molecules, especially macromolecules. In a presently preferred embodiment, the crystallization solutions of the invention are combined as four crystallization solution sets (identified herein as Crystallization Solution Set I, Crystallization Solution Set II, Crystallization Solution Set III and Crystallization Solution Set IV). Each of the four crystallization solution sets includes forty eight different crystallization solutions. Each individual crystallization solution includes a precipitant, a buffer and optionally an additive. The compositions of the individual solutions that constitute Crystallization Solution Set I, Crystallization Solution Set II, Crystallization Solution Set III and Crystallization Solution Set IV are set forth in Tables I, II, III and IV, respectively. The following abbreviations are used: CAPS—3-(cyclohexylamino)-1-propanesulfonic acid; CHES—2-(N-cyclohexylamino)ethanesulfonic acid; HEPES—N-(2-hydroxyethyl)piperazine-N-(2-ethanesulfonic acid); MES—2-(N-morpholino)ethanesulfonic acid; MME—monomethyl ether; OAc—acetate; PEG—polyethylene glycol; Tris—tris(hydroxymethyl)aminomethane.

TABLE I

Compositions of the Crystallization Solutions of Crystallization Solution Set I

| Solution No. | precipitant | buffer (0.1M) | additive(s) |
| --- | --- | --- | --- |
| 1 | 40% (v/v) 2-methyl-2,4-pentanediol | phosphate-citrate pH 4.2 | none |
| 2 | 40% (v/v) ethylene glycol | acetate pH 4.5 | none |
| 3 | 50% (v/v) PEG-200 | citrate pH 5.5 | none |
| 4 | 40% (v/v) PEG-300 | HEPES pH 7.5 | 0.2M NaCl |
| 5 | 40% (v/v) PEG-400 | citrate pH 5.5 | 0.2M $MgCl_2$ |
| 6 | 40% (v/v) PEG-600 | cacodylate pH 6.5 | 0.2M $Ca(OAc)_2$ |
| 7 | 40% (v/v) ethanol | Tris pH 8.5 | 0.05M $MgCl_2$ |

TABLE I-continued

Compositions of the Crystallization Solutions of Crystallization Solution Set I

| Solution No. | precipitant | buffer (0.1M) | additive(s) |
| --- | --- | --- | --- |
| 8 | 35% (v/v) 2-ethoxyethanol | cacodylate pH 6.5 | none |
| 9 | 35% (v/v) 2-propanol | phosphate-citrate pH 4.2 | none |
| 10 | 45% (v/v) glycerol | imidazole pH 8.0 | none |
| 11 | 35% (v/v) 2-methyl-2,4-pentanediol | Tris pH 8.5 | 0.2M $(NH_4)_2SO_4$ |
| 12 | 50% (v/v) ethylene glycol | acetate pH 4.5 | 5% (w/v) PEG-1000 |
| 13 | 30% (v/v) PEG-200 | MES pH 6.0 | 5% (w/v) PEG-3000 |
| 14 | 20% (v/v) PEG-300 | phosphate-citrate pH 4.2 | 0.2M $(NH_4)_2SO_4$, 10% (v/v) glycerol |
| 15 | 50% (v/v) PEG-400 | CHES pH 9.5 | 0.2M NaCl |
| 16 | 30% (v/v) PEG-600 | MES pH 6.0 | 5% (w/v) PEG-1000, 10% (v/v) glycerol |
| 17 | 40% (v/v) 1,2-propanediol | HEPES pH 7.5 | none |
| 18 | 35% (v/v) 2-ethoxyethanol | imidazole pH 8.0 | 0.05M $Ca(OAc)_2$ |
| 19 | 35% (v/v) 2-propanol | Tris pH 8.5 | none |
| 20 | 30% (v/v) 1,2-propanediol | citrate pH 5.5 | 20% (v/v) 2-methyl-2,4-pentanediol |
| 21 | 40% (v/v) 1,2-propanediol | acetate pH 4.5 | 0.05 M $Ca(OAc)_2$ |
| 22 | 40% (v/v) ethylene glycol | Na/K phosphate pH 6.2 | none |
| 23 | 40% (v/v) 2-methyl-2,4-pentanediol | Tris pH 7.0 | 0.2M $(NH_4)_2SO_4$ |
| 24 | 40% (v/v) PEG-400 | Na/K phosphate pH 6.2 | 0.2M NaCl |
| 25 | 30% (v/v) PEG-200 | Tris pH 8.5 | 0.2M $(NH_4)_2HPO_4$ |
| 26 | 40% (v/v) PEG-300 | CHES pH 9.5 | 0.2M NaCl |
| 27 | 30% (v/v) PEG-400 | CAPS pH 10.5 | 0.5M $(NH_4)_2SO_4$, 10% (v/v) glycerol |
| 28 | 30% (v/v) PEG-600 | HEPES pH 7.5 | 0.05M $Li_2SO_4$, 10% (v/v) glycerol |
| 29 | 40% (v/v) PEG-300 | CHES pH 9.5 | 0.2 M sodium citrate |
| 30 | 35% (v/v) 2-ethoxyethanol | citrate pH 5.5 | none |
| 31 | 35% (v/v) 2-propanol | citrate pH 5.5 | 5% (w/v) PEG-1000 |
| 32 | 40% (v/v) 1,2-propanediol | CHES pH 9.5 | 0.2M sodium citrate |
| 33 | 25% (v/v) 1,2-propanediol | imidazole pH 8.0 | 0.2M $Zn(OAc)_2$, 10% (v/v) glycerol |
| 34 | 40% (v/v) 2-methyl-2,4-pentanediol | imidazole pH 8.0 | 0.2M $MgCl_2$ |
| 35 | 40% (v/v) ethylene glycol | HEPES pH 7.5 | 5% (w/v) PEG-3000 |
| 36 | 50% (v/v) PEG-200 | Tris pH 7.0 | 0.05M $Li_2SO_4$ |
| 37 | 40% (v/v) PEG-300 | cacodylate pH 6.5 | 0.2M $Ca(OAc)_2$ |
| 38 | 40% (v/v) PEG-400 | Tris pH 8.5 | 0.2M $Li_2SO_4$ |
| 39 | 40% (v/v) PEG-600 | phosphate-citrate pH 4.2 | none |
| 40 | 40% (v/v) ethanol | phosphate-citrate pH 4.2 | 5% (w/v) PEG-1000 |
| 41 | 25% (v/v) 1,2-propanediol | phosphate-citrate pH 4.2 | 5% (w/v) PEG-3000, 10% (v/v) glycerol |

TABLE I-continued

Compositions of the Crystallization Solutions of Crystallization Solution Set I

| Solution No. | precipitant | buffer (0.1M) | additive(s) |
|---|---|---|---|
| 42 | 40% (v/v) ethylene glycol | Tris pH 7.0 | none |
| 43 | 50% (v/v) ethylene glycol | Tris pH 8.5 | 0.2M MgCl$_2$ |
| 44 | 50% (v/v) PEG-200 | cacodylate pH 6.5 | 0.2M Zn(OAc)$_2$ |
| 45 | 20% (v/v) PEG-300 | Tris pH 8.5 | 5% (w/v) PEG-8000, 10% (v/v) glycerol |
| 46 | 40% (v/v) PEG-400 | MES pH 6.0 | 5% (w/v) PEG-3000 |
| 47 | 50% (v/v) PEG-400 | acetate pH 4.5 | 0.2M Li$_2$SO$_4$ |
| 48 | 40% (v/v) PEG-600 | imidazole pH 8.0 | 0.2M Zn(OAc)$_2$ |

TABLE II

Compositions of the Crystallization Solutions of Crystallization Solution Set II

| Solution No. | precipitant | buffer (0.1M) | additive(s) |
|---|---|---|---|
| 1 | 40% (v/v) 2-methyl-2,4-pentanediol | cacodylate pH 6.5 | 5% (w/v) PEG-8000 |
| 2 | 50% (v/v) PEG-200 | CHES pH 9.5 | none |
| 3 | 40% (v/v) ethylene glycol | phosphate-citrate pH 4.2 | 0.2M (NH$_4$)$_2$SO$_4$ |
| 4 | 40% (v/v) PEG-400 | HEPES pH 7.5 | 0.2M Ca(OAc)$_2$ |
| 5 | 40% (v/v) PEG-300 | Tris pH 7.0 | 5% (w/v) PEG-1000 |
| 6 | 30% (v/v) PEG-600 | cacodylate pH 6.5 | 1M NaCl, 10% (v/v) glycerol |
| 7 | 40% (v/v) ethanol | Tris pH 7.0 | none |
| 8 | 35% (v/v) 2-ethoxyethanol | Na/K phosphate pH 6.2 | 0.2M NaCl |
| 9 | 35% (v/v) 2-propanol | imidazole pH 8.0 | 0.05M Zn(OAc)$_2$ |
| 10 | 40% (v/v) 1,2-propanediol | acetate pH 4.5 | none |
| 11 | 25% (v/v) 1,2-propanediol | Na/K phosphate pH 6.2 | 10% (v/v) glycerol |
| 12 | 40% (v/v) 1,2-propanediol | citrate pH 5.5 | 0.2M NaCl |
| 13 | 35% (v/v) 2-methyl-2,4-pentanediol | cacodylate pH 6.5 | 0.05M Zn(OAc)$_2$ |
| 14 | 40% (v/v) ethylene glycol | imidazole pH 8.0 | 0.2M Ca(OAc)$_2$ |
| 15 | 50% (v/v) PEG-200 | Na/K phosphate pH 6.2 | 0.2M NaCl |
| 16 | 20% (v/v) PEG-300 | imidazole pH 8.0 | 1M (NH$_4$)$_2$SO$_4$, 10% (v/v) glycerol |
| 17 | 50% (v/v) PEG-400 | MES pH 6.0 | none |
| 18 | 40% (v/v) PEG-300 | phosphate-citrate pH 4.2 | none |
| 19 | 40% (v/v) PEG-600 | acetate pH 4.5 | 0.2M MgCl$_2$ |
| 20 | 50% (v/v) ethylene glycol | CHES pH 9.5 | 0.5M K/Na tartrate |
| 21 | 35% (v/v) 2-ethoxyethanol | Tris pH 8.5 | 0.2M Li$_2$SO$_4$ |
| 22 | 35% (v/v) 2-propanol | cacodylate pH 6.5 | 0.2M MgCl$_2$ |
| 23 | 30% (v/v) 1,2-propanediol | HEPES pH 7.5 | 20% (v/v) PEG-400 |
| 24 | 25% (v/v) 1,2-propanediol | Tris pH 8.5 | 0.2M MgCl$_2$, 10% (v/v) glycerol |
| 25 | 40% (v/v) 2-methyl-2,4-pentanediol | CAPS pH 10.5 | none |

TABLE II-continued

Compositions of the Crystallization Solutions of Crystallization Solution Set II

| Solution No. | precipitant | buffer (0.1M) | additive(s) |
|---|---|---|---|
| 26 | 40% (v/v) ethylene glycol | MES pH 6.0 | 0.2M Zn(OAc)$_2$ |
| 27 | 50% (v/v) PEG-200 | Tris pH 7.0 | none |
| 28 | 40% (v/v) PEG-300 | imidazole pH 8.0 | 0.2M Zn(OAc)$_2$ |
| 29 | 30% (v/v) PEG-400 | HEPES pH 7.5 | 5% (w/v) PEG-3000, 10% (v/v) glycerol |
| 30 | 40% (v/v) PEG-600 | citrate pH 5.5 | none |
| 31 | 40% (v/v) PEG-600 | CHES pH 9.5 | none |
| 32 | 35% (v/v) 2-propanol | acetate pH 4.5 | none |
| 33 | 45% (v/v) glycerol | cacodylate pH 6.5 | 0.2M Ca(OAc)$_2$ |
| 34 | 25% (v/v) 1,2-propanediol | Tris pH 7.0 | 0.2M (NH$_4$)$_2$SO$_4$, 10% (v/v) glycerol |
| 35 | 40% (v/v) 2-methyl-2,4-pentanediol | citrate pH 5.5 | none |
| 36 | 50% (v/v) PEG-200 | cacodylate pH 6.5 | 0.2M MgCl$_2$ |
| 37 | 50% (v/v) ethylene glycol | imidazole pH 8.0 | none |
| 38 | 40% (v/v) PEG-400 | acetate pH 4.5 | none |
| 39 | 30% (v/v) PEG-600 | Tris pH 7.0 | 0.5M (NH$_4$)$_2$SO$_4$, 10% (v/v) glycerol |
| 40 | 40% (v/v) 2-methyl-2,4-pentanediol | CHES pH 9.5 | none |
| 41 | 50% (v/v) ethylene glycol | HEPES pH 7.5 | 0.2M Li$_2$SO$_4$ |
| 42 | 30% (v/v) PEG-200 | acetate pH 4.5 | 0.1M NaCl |
| 43 | 40% (v/v) PEG-400 | imidazole pH 8.0 | none |
| 44 | 35% (v/v) 2-methyl-2,4-pentanediol | acetate pH 4.5 | 10% (v/v) glycerol |
| 45 | 40% (v/v) PEG-300 | acetate pH 4.5 | 0.2M NaCl |
| 46 | 30% (v/v) PEG-200 | CAPS pH 10.5 | 0.2M (NH$_4$)$_2$SO$_4$ |
| 47 | 50% (v/v) PEG-200 | HEPES pH 7.5 | none |
| 48 | 50% (v/v) PEG-200 | phosphate-citrate pH 4.2 | 0.2M NaCl |

TABLE III

Compositions of the Crystallization Solutions of Crystallization Solution Set III

| Solution No. | precipitant | buffer (0.1M) | salt (0.2M) |
|---|---|---|---|
| 1 | 20% (w/v) PEG-8000 | CHES pH 9.5 | none |
| 2 | 10% (v/v) 2-propanol | HEPES pH 7.5 | NaCl |
| 3 | 15% (v/v) ethanol | CHES pH 9.5 | none |
| 4 | 35% (v/v) 2-methyl-2,4-pentanediol | imidazole pH 8.0 | MgCl$_2$ |
| 5 | 30% (v/v) PEG-400 | CAPS pH 10.5 | none |
| 6 | 20% (w/v) PEG-3000 | citrate pH 5.5 | none |
| 7 | 10% (w/v) PEG-800 | MES pH 6.0 | Zn(OAc)$_2$ |
| 8 | 2.0M (NH$_4$)$_2$SO$_4$ | citrate pH 5.5 | none |
| 9 | 1.0M (NH$_4$)$_2$HPO$_4$ | acetate pH 4.5 | none |
| 10 | 20% (w/v) PEG-2000 MME | Tris pH 7.0 | none |
| 11 | 20% (v/v) 1,4-butanediol | MES pH 6.0 | Li$_2$SO$_4$ |
| 12 | 20% (w/v) PEG-1000 | imidazole pH 8.0 | Ca(OAc)$_2$ |
| 13 | 1.26M (NH$_4$)$_2$SO$_4$ | cacodylate pH 6.5 | none |
| 14 | 1.0M sodium citrate | cacodylate pH 6.5 | none |
| 15 | 10% (w/v) PEG-3000 | imidazole pH 8.0 | Li$_2$SO$_4$ |
| 16 | 2.5M NaCl | Na/K phosphate pH 6.2 | none |
| 17 | 30% (v/v) PEG-8000 | acetate pH 4.5 | Li$_2$SO$_4$ |
| 18 | 1.0M K/Na tartrate | imidazole pH 8.0 | NaCl |
| 19 | 20% (w/v) PEG-1000 | Tris pH 7.0 | none |

TABLE III-continued

Compositions of the Crystallization Solutions of Crystallization Solution Set III

| Solution No. | precipitant | buffer (0.1M) | salt (0.2M) |
|---|---|---|---|
| 20 | 0.4M $NaH_2PO_4$/ 1.6M $K_2HPO_4$ | imidazole pH 8.0 | NaCl |
| 21 | 20% (w/v) PEG-8000 | HEPES pH 7.5 | none |
| 22 | 10% (v/v) 2-propanol | Tris pH 8.5 | none |
| 23 | 15% (v/v) ethanol | imidazole pH 8.0 | $MgCl_2$ |
| 24 | 35% (v/v) 2-methyl-2,4-pentanediol | Tris pH 7.0 | NaCl |
| 25 | 30% (v/v) PEG-400 | Tris pH 8.5 | $MgCl_2$ |
| 26 | 10% (w/v) PEG-3000 | CHES pH 9.5 | none |
| 27 | 1.2M $NaH_2PO_4$/ 0.8M $K_2HPO_4$ | CAPS pH 10.5 | $Li_2SO_4$ |
| 28 | 20% (w/v) PEG-3000 | HEPES pH 7.5 | NaCl |
| 29 | 10% (w/v) PEG-8000 | CHES pH 9.5 | NaCl |
| 30 | 1.26M $(NH_4)_2SO_4$ | acetate pH 4.5 | NaCl |
| 31 | 20% (w/v) PEG-8000 | phosphate-citrate pH 4.2 | NaCl |
| 32 | 10% (w/v) PEG-3000 | Na/K phosphate pH 6.2 | none |
| 33 | 2.0M $(NH_4)_2SO_4$ | CAPS pH 10.5 | $Li_2SO_4$ |
| 34 | 1.0M $(NH_4)_2HP_4$ | imidazole pH 8.0 | none |
| 35 | 20% (v/v) 1,4-butanediol | acetate pH 4.5 | none |
| 36 | 1.0M sodium citrate | imidazole pH 8.0 | none |
| 37 | 2.5M NaCl | imidazole pH 8.0 | none |
| 38 | 1.0M K/Na tartrate | CHES pH 9.5 | $Li_2SO_4$ |
| 39 | 20% (w/v) PEG-1000 | phosphate-citrate pH 4.2 | $Li_2SO_4$ |
| 40 | 10% (v/v) 2-propanol | MES pH 6.0 | $Ca(OAc)_2$ |
| 41 | 30% (w/v) PEG-3000 | CHES pH 9.5 | none |
| 42 | 15% (v/v) ethanol | Tris pH 7.0 | none |
| 43 | 35% (v/v) 2-methyl-2,4-pentanediol | Na/K phosphate pH 6.2 | none |
| 44 | 30% (v/v) PEG-400 | acetate pH 4.5 | $Ca(OAc)_2$ |
| 45 | 20% (w/v) PEG-3000 | acetate pH 4.5 | none |
| 46 | 10% (w/v) PEG-8000 | imidazole pH 8.0 | $Ca(OAc)_2$ |
| 47 | 1.26M $(NH_4)_2SO_4$ | Tris pH 8.5 | $Li_2SO_4$ |
| 48 | 20% (w/v) PEG-1000 | acetate pH 4.5 | $Zn(OAc)_2$ |

TABLE IV

Compositions of the Crystallization Solutions of Crystallization Solution Set IV

| Solution No. | precipitant | buffer (0.1M) | salt (0.2M) |
|---|---|---|---|
| 1 | 10% (w/v) PEG-3000 | acetate pH 4.5 | $Zn(OAc)_2$ |
| 2 | 35% (v/v) 2-methyl-2,4-pentanediol | MES pH 6.0 | $Li_2SO_4$ |
| 3 | 20% (w/v) PEG-8000 | Tris pH 8.5 | $MgCl_2$ |
| 4 | 2.0M $(NH_4)_2SO_4$ | cacodylate pH 6.5 | NaCl |
| 5 | 20% (v/v) 1,4-butanediol | HEPES pH 7.5 | NaCl |
| 6 | 10% (v/v) 2-propanol | phosphate-citrate pH 4.2 | $Li_2SO_4$ |
| 7 | 30% (w/v) PEG-3000 | Tris pH 7.0 | NaCl |
| 8 | 10% (w/v) PEG-8000 | Na/K phosphate pH 6.2 | NaCl |
| 9 | 2.0M $(NH_4)_2SO_4$ | phosphate-citrate pH 4.2 | none |
| 10 | 1.0M $(NH_4)_2HP_4$ | Tris pH 8.5 | none |
| 11 | 10% (v/v) 2-propanol | cacodylate pH 6.5 | $Zn(OAc)_2$ |
| 12 | 30% (v/v) PEG-400 | cacodylate pH 6.5 | $Li_2SO_4$ |
| 13 | 15% (v/v) ethanol | citrate pH 5.5 | $Li_2SO_4$ |
| 14 | 20% (w/v) PEG-1000 | Na/K phosphate pH 6.2 | NaCl |
| 15 | 1.26M $(NH_4)_2SO_4$ | HEPES pH 7.5 | none |
| 16 | 1.0M sodium citrate | CHES pH 9.5 | none |
| 17 | 2.5M NaCl | Tris pH 7.0 | $MgCl_2$ |
| 18 | 20% (w/v) PEG-3000 | Tris pH 7.0 | $Ca(OAc)_2$ |
| 19 | 1.6M $NaH_2PO_4$/ 0.4 $K_2HPO_4$ | phosphate-citrate pH 4.2 | none |

TABLE IV-continued

Compositions of the Crystallization Solutions of Crystallization Solution Set IV

| Solution No. | precipitant | buffer (0.1M) | salt (0.2M) |
|---|---|---|---|
| 20 | 15% (v/v) ethanol | MES pH 6.0 | $Zn(OAc)_2$ |
| 21 | 35% (v/v) 2-methyl-2,4-pentanediol | acetate pH 4.5 | none |
| 22 | 10% (v/v) 2-propanol | imidazole pH 8.0 | none |
| 23 | 15% (v/v) ethanol | HEPES pH 7.5 | $MgCl_2$ |
| 24 | 30% (w/v) PEG-8000 | imidazole pH 8.0 | NaCl |
| 25 | 35% (v/v) 2-methyl-2,4-pentanediol | HEPES pH 7.5 | NaCl |
| 26 | 30% (v/v) PEG-400 | CHES pH 9.5 | none |
| 27 | 10% (w/v) PEG-3000 | cacodylate pH 6.5 | $MgCl_2$ |
| 28 | 20% (w/v) PEG-8000 | MES pH 6.0 | $Ca(OAc)_2$ |
| 29 | 1.26M $(NH_4)_2SO_4$ | CHES pH 9.5 | NaCl |
| 30 | 20% (v/v) 1,4-butanediol | imidazole pH 8.0 | $Zn(OAc)_2$ |
| 31 | 1.0M sodium citrate | Tris pH 7.0 | NaCl |
| 32 | 20% (w/v) PEG-1000 | Tris pH 8.5 | none |
| 33 | 1.0M $(NH_4)_2HP_4$ | citrate pH 5.5 | NaCl |
| 34 | 10% (w/v) PEG-8000 | imidazole pH 8.0 | none |
| 35 | 0.8M $NaH_2PO_4$/ 1.2 $K_2HPO_4$ | acetate pH 4.5 | none |
| 36 | 10% (w/v) PEG-3000 | phosphate-citrate pH 4.2 | NaCl |
| 37 | 1.0M K/Na tartrate | Tris pH 7.0 | $Li_2SO_4$ |
| 38 | 2.5M NaCl | acetate pH 4.5 | $Li_2SO_4$ |
| 39 | 20% (w/v) PEG-8000 | CAPS pH 10.5 | NaCl |
| 40 | 20% (w/v) PEG-3000 | imidazole pH 8.0 | $Zn(OAc)_2$ |
| 41 | 2.0M $(NH_4)_2SO_4$ | Tris pH 7.0 | $Li_2SO_4$ |
| 42 | 30% (v/v) PEG-400 | HEPES pH 7.5 | NaCl |
| 43 | 10% (w/v) PEG-8000 | Tris pH 7.0 | $MgCl_2$ |
| 44 | 20% (w/v) PEG-1000 | cacodylate pH 6.5 | $MgCl_2$ |
| 45 | 1.26M $(NH_4)_2SO_4$ | MES pH 6.0 | none |
| 46 | 1.0M $(NH_4)_2HP_4$ | imidazole pH 8.0 | NaCl |
| 47 | 2.5M NaCl | imidazole pH 8.0 | $Zn(OAc)_2$ |
| 48 | 1.0M K/Na tartrate | MES pH 6.0 | none |

In another embodiment, the present invention includes subsets of the crystallization solutions of Crystallization Solution Set I, Crystallization Solution Set II, Crystallization Solution Set III and Crystallization Solution Set IV. Presently preferred crystallization solution subsets are: subset I, solution numbers 1, 9, 10 and 28 of Crystallization Solution Set I; subset II, solution numbers 1, 8, 14, 26, 30 and 34 of Crystallization Solution Set II; subset III, solution numbers 2, 11, 18, 25, 26, 28, 29, 31, 38, 41 and 46 of Crystallization Solution Set III; and subset IV, solution numbers 2, 3, 5, 6, 7, 8, 17, 22, 24, 32, 34, 37, 43 and 48 of Crystallization Solution Set IV. Thus, crystallization solution subsets preferably include at least one of subset I, subset II, subset III and subset IV.

All of the crystallization solutions are made with ultrapure ASTM Type I water, and sterile-filtered into sterile tubes. The sterile crystallization solutions should be stored at room temperature. The following stock solutions are utilized to formulate the crystallization solutions.

Acetate pH 4.5.

1 M acetic acid and 1 M sodium acetate solutions are mixed together to make a pH 4.5 acetate stock solution. A 10-fold dilution of this stock solution is used in the final crystallization solution formulations, if required.

Cacodylate pH 6.5.

A 1 M sodium cacodylate stock solution is adjusted to pH 6.5 with concentrated (37%) HCl. A 10-fold dilution of this stock solution is used in the final crystallization solution formulations, if required.

CAPS pH 10.5.

A 1 M CAPS stock solution is adjusted to pH 10.5 with 50% (w/v) NaOH. A 10-fold dilution of this solution is used in the final crystallization solution formulations, if required.

CHES pH 9.5.

A 1 M CHES stock solution is adjusted to pH 9.5 with 50% NaOH. A 10-fold dilution of this stock solution is used in the final crystallization solution formulations, if required.

Citrate pH 5.5.

0.5 M citric acid and 0.5 M sodium citrate solutions are mixed together to make a pH 5.5 citrate stock solution. A 5-fold dilution of this stock solution is used in the final crystallization solution formulations, if required.

HEPES pH 7.5.

A 1 M HEPES stock solution is adjusted to pH 7.5 with 50% NaOH. A 10-fold dilution of this stock solution is used in the final crystallization solution formulations, if required.

Imidazole pH 8.0.

A 1 M imidazole stock solution is adjusted to pH 8.0 with concentrated HCl. A 10-fold dilution of this stock solution is used in the final crystallization solution formulations, if required.

MES pH 6.0.

A 1 M MES stock solution is adjusted to pH 6.0 with concentrated HCl. A 10-fold dilution of this stock solution is used in the final crystallization solution formulations, if required.

Na/K phosphate pH 6.2.

0.5 M $Na_2HPO_4$ and 0.5 M $KH_2PO_4$ solutions are mixed together to make a pH 6.2 Na/K phosphate stock solution. A 5-fold dilution of this stock solution is used in the final crystallization solution formulations, if required.

Phosphate-citrate pH 4.2.

0.5 M $Na_2HPO_4$ and 0.5 M citric acid solutions are mixed together to make a pH 4.2 phosphate-citrate stock solution. A 5-fold dilution of this stock solution is used in the final crystallization solution formulations, if required.

Tris pH 7.0 (or pH 8.5).

A 1 M Tris base stock solution is adjusted to pH 7.0 or 8.5 with concentrated HCl. 10-fold dilutions of these stock solutions are used in the final crystallization solution formulations, if required.

When using the crystallization solutions of the present invention to crystallize a molecule, the molecule should be as highly purified as possible. If the molecule to be crystallized is a protein, preferably the protein should appear greater than 97% pure as determined by silver-stained SDS-PAGE. When the molecular sample is a biological macromolecule, such as a protein, the molecular sample should be in as minimal a buffer as possible (i.e., the buffer should contain as few chemical components as possible) to help maintain the biological activity of the macromolecule, and the molecular sample should preferably be at a concentration of 5–15 mg/ml.

The crystallization solutions of the present invention can be used in any crystallization technique. Presently preferred crystallization techniques for use with the crystallization solutions of the present invention are vapor diffusion techniques as described, for example, in Gilliland, G. L. & Davies, D. R. (1984) *Methods in Enzymol.* 104:370–381; McPherson, A. (1990) *Eur. J. Biochem.* 189:1–23 and Weber, P. C. (1991) *Adv. in Prot. Chem.* 41:1–36. For example, hanging drop crystallization is a vapor diffusion technique that typically utilizes crystallization plates including a plurality of reservoirs, such as those available from Hampton Research (27632 El Lazo Rd., Laguna Niguel, Calif. 92677) and ICN-Flow (3300 Hyland Ave., Costa Mesa, Calif. 92626). In an exemplary hanging drop crystallization experiment, sealant, such as petroleum jelly or vacuum grease, is applied to the rim of a crystallization plate reservoir and 0.5–1.0 ml of a single crystallization solution of the present invention is pipetted into the reservoir. 1–10 µl (depending on availability) of the macromolecule sample is pipetted onto a siliconized cover slip (plates from Hampton Research and ICN-Flow typically require 22 mm square or round cover slips) and an equal volume of the crystallization solution that is in the reservoir is added to the sample drop on the cover slip and mixed by repeatedly aspirating and dispensing the solution from the pipettor. The cover slip is inverted and sealed over the reservoir. When a crystallization solution set of the present invention is utilized, this sequence of events can be repeated for all 48 crystallization solutions in the crystallization solution set.

Similarly, sitting drop crystallization is a type of vapor diffusion technique that utilizes sitting drop crystallization plates, including a plurality of reservoirs within each of which is located a pedestal that includes a sample depression within its upper end, such as those available from Charles Supper Co. (15 Tech Circle, Natick, Mass. 01760). In an exemplary sitting drop crystallization experiment utilizing the crystallization solutions of the present invention, 0.5–1.0 ml of a single crystallization solution are pipetted into a reservoir of a sitting drop crystallization plate and 1–10 µl of the sample are pipetted into the sample depression of the sitting drop pedestal. An equal volume of the crystallization solution that is in the reservoir is added to the sample drop and mixed. This procedure can be repeated, utilizing a different crystallization solution in each of the reservoirs. The reservoirs can be individually sealed with sealant and cover slips, or the entire sitting drop plate can be sealed with a single piece of clear sealing tape after application of sample to all wells has been completed.

By way of non-limiting example, other crystallization techniques that can utilize the crystallization solutions of the present invention include sandwich drop vapor diffusion which is similar to hanging drop and sitting drop vapor diffusion, except that the crystallization drop is contacted on two sides by glass or plastic surfaces. See, e.g., A. McPherson, *Eur. J. Biochem.* 189:1–23 (1990). Sandwich drop crystallization plates are available from Hampton Research and ICN-Flow. In the technique of crystallization using oils, the rate of equilibration by vapor diffusion can be modulated by placing a layer of oil between the crystallization drop and the reservoir (see, e.g., Chayen, N. E. (1997) *J. Appl. Cryst.* 30:198–202). Alternatively, oils can be used to seal microbatch crystallization drops, in the absence of a larger reservoir of crystallization solution (see, e.g., Chayen N. E. et al. (1990) *J. Appl. Cryst.* 23:297–302). In the technique of capillary crystallization, layers of sample solution and crystallization solution can be deposited in a capillary 0.5–1.0 mm in diameter, either with an air space between the solutions or with a direct liquid—liquid interface. Crystallization occurs by vapor diffusion or liquid—liquid diffusion inside the capillary.

If the supply of sample permits, it is preferable to set up the crystallizations in duplicate, with one set of crystallizations placed at room temperature (typically from about 16° C. to about 25° C.), and the other one at 4° C. Regardless of the crystallization method used, the crystallization trials should preferably be stored in a place free of vibrations or mechanical shock, which could result in premature precipitation.

Typically, observations of crystallization trials are recorded every one or two days. The crystallization trials can be viewed under a stereo microscope at 10–100× magnification. If less than ten percent of the samples in the crystallization screen do not show heavy precipitate after one day, it may be desirable to increase the concentration of the sample molecule. If more than fifty percent of the samples in the crystallization screen show heavy precipitate after one day, it may be desirable to reduce the sample molecule concentration.

Crystals suitable for X-ray data collection are generally 0.1 mm or greater in their smallest dimension, and have clean, sharp edges. Viewing the crystallization trials between crossed polarizers often aids in distinguishing microcrystals from amorphous precipitate. Except for the rather unusual occurrence of a cubic space group, X-ray diffraction quality biological macromolecule crystals are birefringent (have more than one refractive index), and turn polarized light. When rotated between crossed polarizers, the intensity and/or color of light transmitted through birefringent crystals will change, with a periodicity of 90°. Amorphous precipitates will not transmit and turn polarized light.

If small crystals, or crystals which do not grow robustly in all three dimensions, are obtained in an initial screen, then a variety of art-recognized techniques can be utilized to obtain better crystals without undue experimentation. For example, the crystallization conditions may be optimized by adjusting parameters, such as pH and temperature. Small crystals can be grown larger by seeding techniques (see, e.g., Thaller, C. et al. (1985) *Methods in Enzymol.* 114:132–135; Stura, E. A. & Wilson, I. A. (1990) *METHODS: A Companion to Methods in Enzymol.* 1:38–49). Using larger volume crystallization drops may also increase crystal size (see, e.g., Fox, K. M. & Karplus, P. A. (1993) *J. Mol. Biol.* 234:502–507).

Ideally, crystals should be harvested straight from the crystallization drop and mounted for data collection. The solutions of Crystallization Solution Set I and Crystallization Solution Set II have been specially formulated so that they will freeze as a clear amorphous glass, and not interfere with the diffraction of macromolecule crystals grown in these solutions. Thus, crystals may be mounted directly from the crystallization drop, and frozen in liquid nitrogen or a stream of gaseous nitrogen for cryo-temperature X-ray diffraction data collection (as described, for example, in Rodgers, D. W. (1994) *Structure,* 2:1135–1140). Again, crystallization conditions can be optimized, if necessary, by a variety of art-recognized techniques to generate very high quality crystals. For example, cryo-stabilizers, such as glycerol, glucose, or PEG-400 can be added to the crystallization solutions of the present invention. Also, some macromolecule crystals may be damaged upon freezing, resulting in poor diffraction compared with their diffraction at room temperature. For such crystals, cross-linking reagents such as glutaraldehyde may be used to make the crystals more resistant to mechanical stress upon freezing.

The four crystallization solution sets of the present invention have been shown to reproducibly crystallize proteins which are known to crystallize or are known to have a propensity to crystallize. These model proteins include apoferritin, thaumatin, lysozyme and canavalin. These readily crystallizable proteins represent a broad spectrum of biochemical activities. For example, apoferritin is a large iron carrier protein in blood, thaumatin is an especially sweet protein from potato, and lysozyme is from hen egg whites and is important for breaking down the glycoprotein shell of bacteria.

Thus, for example, lysozyme crystallizes in solution number 28 of Crystallization Solution Set I; solution number 30 of Crystallization Solution Set II; solution numbers 28, 29, 31, 38 and 41 of Crystallization Solution Set III and in solution numbers 3, 7, 17, 24, 37, 43 and 48 of Crystallization Solution Set IV. Canavalin crystallizes in solution number 10 of Crystallization Solution Set I; solution numbers 2, 26 and 46 of Crystallization Solution Set III and in solution numbers 5, 8, 22 and 34 of Crystallization Solution Set IV. Thaumatin crystallizes in solution number 14 of Crystallization Solution Set II; solution numbers 18 and 38 of Crystallization Solution Set III and in solution number 37 of Crystallization Solution Set IV. Apoferritin crystallizes in solution numbers 1 and 26 of Crystallization Solution Set II.

The crystallization solutions of the present invention have also been used to successfully crystallize human topoisomerase I, a protein which is notoriously difficult to crystallize. Co-crystallization of human topoisomerase I, together with a 22 bp duplex DNA molecule, was achieved using solution number 25 of Crystallization Solution Set III, and permitted the structural determination of human topoisomerase I. Subsequent work with a different topoisomerase I construct led to the identification of solution number 32 of Crystallization Solution Set IV as a good crystallization condition as well.

In another aspect, the present invention provides kits including a plurality of crystallization solutions of the present invention and at least one crystallization plate that includes a plurality of reservoirs. Preferably the crystallization solutions are disposed within the reservoirs of the crystallization plates which can therefore be immediately used to conduct crystallization experiments. Any crystallization plates can be included in the kits of the present invention, including, by way of non-limiting example: Hampton Research plate models VDX, Linbro, Costar, Cryschem, Q-Plate, Q-Plate II and Crystal Clear Strips; Charles Supper Co. sitting drop plates and ICN Linbro model. The presently preferred crystallization plates are disclosed in copending U.S. patent application Ser. No. 09/150,629, issued on Mar. 21, 2000 as U.S. Pat. No. 6,039,804, incorporated herein by reference.

Figure 1:
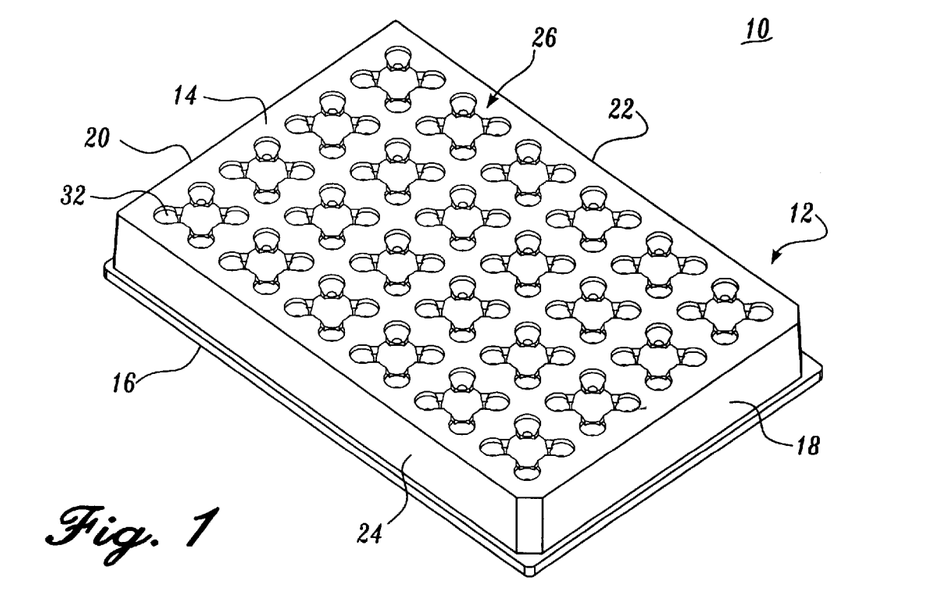
FIG. 1 is a three dimensional view of a presently preferred crystallization plate useful for inclusion in a kit of the present invention.
Figure 2:
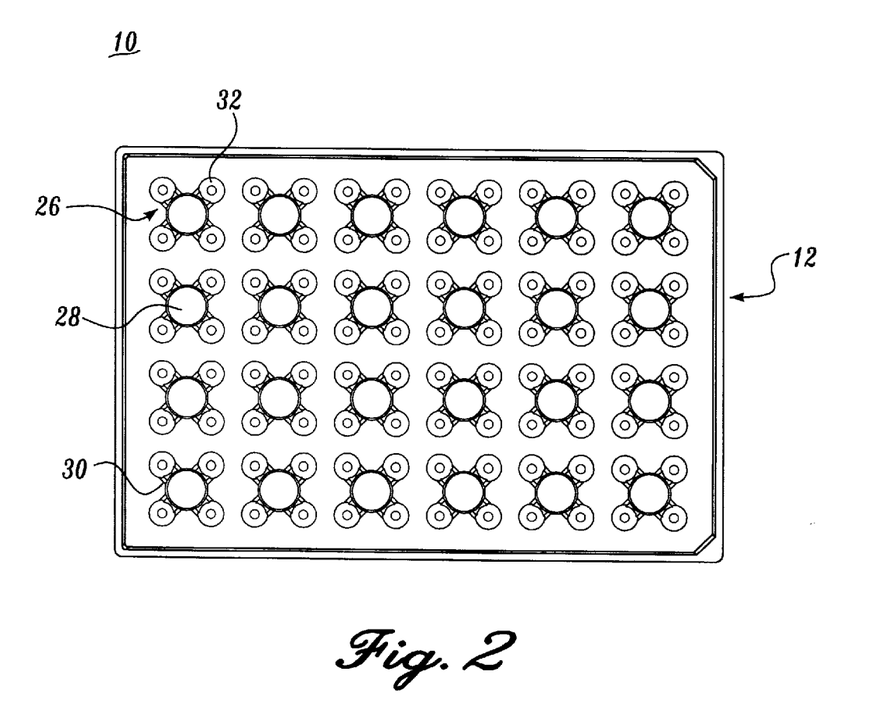
FIG. 2 is a view of the upper surface of a presently preferred crystallization plate useful for inclusion in a kit of the present invention.

By way of representative example, a presently preferred crystallization plate for inclusion in a kit of the present invention is shown in FIGS. 1 and 2. With reference to FIGS. 1 and 2, crystallization tray 10 includes a body 12 having an upper surface 14, a lower surface 16, a first end 18, a second end 20, a first side 22 and a second side 24. Body 12 defines a plurality of crystallization units 26. Each crystallization unit 26 includes a central reservoir 28, four diffusion channels 30 and four drop chambers 32. Each drop chamber 32 is connected to central reservoir 28 by one diffusion channel 30. While the plate of FIGS. 1 and 2 is preferred, other plates or arrays of vessels may suitably be employed with the solutions of the present invention.

In a presently preferred embodiment, the present invention provides kits including at least one crystallization plate and a set of crystallization solutions selected from the group of crystallization solution sets consisting of Crystallization Solution Set I, Crystallization Solution Set II, Crystallization Solution Set III and Crystallization Solution Set IV. In another presently preferred embodiment, the present invention provides kits including at least one crystallization plate and a subset of crystallization solutions selected from the group of subsets consisting of: subset I, solution numbers 1, 9, 10 and 28 of Crystallization Solution Set I; subset II, solution numbers 1, 8, 14, 26, 30 and 34 of Crystallization Solution Set II; subset III, solution numbers 2, 11, 18, 25, 26, 28, 29, 31, 38, 41 and 46 of Crystallization Solution Set III; and subset IV, solution numbers 2, 3, 5, 6, 7, 8, 17, 22, 24, 32, 34, 37, 43 and 48 of Crystallization Solution Set IV.

A kit of the present invention may optionally include, for example, water-permeable silicone oil DC200 (BDH, Gallard Schlesinger Industries, 584 Mineola Ave., Carle Place, N.Y. 11514-1744, Catalogue number #63002 4N), and/or paraffin oil (Fluka Chemical Corp., 980 South 2nd St., Ronkonkoma, N.Y. 11779-7238, catalogue number #76235) which are useful in microbatch crystallizations, and vapor diffusion crystallizations with oils.

The following examples merely illustrate the best mode now contemplated for practicing the invention, but should not be construed to limit the invention.

EXAMPLE 1

Crystallization of Canavalin

Purified Canavalin (from Jack Bean) was kindly provided by Dr. Alex McPherson (University of California, Riverside). Protein slurry was dissolved by the addition of 1 M ammonium hydroxide until the solution appeared transparent. The sample was then adjusted to 200 mM sodium chloride by the addition of 5 M sodium chloride stock solution. The pH of the sample was then adjusted to pH 7.0 with the addition of 0.1 M hydrochloric acid. The final concentration of protein was determined to be 30 milligrams per milliliter. This final protein solution was used in crystallization trials with Crystallization Solution Sets I, II, III and IV. The apparatus used for the experiments was the Compact Crystallization Plate (Emerald Biostructures, 7869 N.E. Day Rd. W., Bainbridge Island, Wash. 98110).

The crystallization experiments were set up as follows. 0.2 milliliters of crystallization solution were placed into individual reservoir chambers of a Compact Crystallization Plate. Two microliters (µl) of the crystallization solution were removed from the reservoir chambers and placed into individual drop chambers that are connected to the reservoir chamber by a vapor diffusion channel. 2 µl of the dissolved protein were then mixed with the 2 µl of crystallisation solution in the drop chamber. The crystallization chambers were sealed with Crystal Clear tape (Manco, Inc., 32150 Just Imagine Drive, Avon Ohio 44011), and the plates were maintained at 14° C. Crystals formed within twelve to sixteen hours.

Canavalin crystallized in solution number 10 of Crystallization Solution Set I; solution numbers 2, 26 and 46 of Crystallization Solution Set III and in solution numbers 5, 8, 22 and 34 of Crystallization Solution Set IV.

EXAMPLE 2

Crystallization of Lysozyme

Purified lysozyme (obtained from hen egg whites) was purchased from Sigma-Aldrich Co. (Catalogue number L7651). The protein powder was dissolved in water to a final concentration of 20 milligrams per milliliter (mg/ml). This final protein solution was used in crystallization trials with Crystallization Solution Sets I, II, III and IV exactly as described in Example 1 for Canavalin. Crystals formed within four to five days. Lysozyme crystallized in solution number 28 of Crystallization Solution Set I; solution number 30 of Crystallization Solution Set II; solution numbers 28, 29, 31, 38 and 41 of Crystallization Solution Set III and in solution numbers 3, 7, 17, 24, 37, 43 and 48 of Crystallization Solution Set IV.

EXAMPLE 3

Crystallization of Apoferritin

Purified Apoferritin (Horse Spleen) was purchased from Sigma-Aldrich Co. (Catalogue Number A4890). The protein solution was at 25 mg/ml and was used directly in crystallization trials with Crystallization Solution Sets I, II, III and IV exactly as described in Example 1 for Canavalin. Crystals formed within two to five days. Apoferritin crystallized in solution numbers 1 and 26 of Crystallization Solution Set II.

EXAMPLE 4

Crystallization of Thaumatin

Purified Thaumatin (purified from *Thaumatococcus daniellii*) was purchased from Sigma-Aldrich Co. (Caalogue number T7638). The protein powder was dissolved in water to a final concentration of 25 mg/ml. This final protein solution was used in crystallization trials with Crystallization Solution Sets I, II, III and IV exactly as described in Example 1 for Canavalin. Crystals formed within three to five days. Thaumatin crystallized in solution number 14 of Crystallization Solution Set II; solution numbers 18 and 38 of Crystallization Solution Set III and in solution number 37 of Crystallization Solution Set IV.

EXAMPLE 5

Crystallization of Topoisomerase I

Purified Human Topoisomerase I (70 kDa, amino acids 175 to 765 of the human topoisomerase I disclosed in P. D'Arpa et al., *Proc. Nat'l Acad. Sci. U.S.A.* 85: 2543–2547 (1988), with an active site mutation of amino acid 723 from tyrosine to phenylalanine) was used in a crystallization trial with Crystallization Solution Sets I, II, III and IV as follows. The human Topoisomerase I was at 10 mg/ml in storage buffer (10 mM Tris-hydrochloric acid pH 7.5, 1 mM EDTA, 1 mM DTT). 0.6 milliliters of crystallization solution were placed into individual reservoir chambers of a Cryschem sitting drop crystallization plate (Charles Supper & Co., 15 Tech Circle, Natick, Mass. 01760). 2 µl of the topoisomerase I solution were placed into individual sitting drop chambers of the Cryschem plate. 1 µl of a 22 base-pair duplex oligonucleotide (0.2 mM duplex oligonucleotide in 6 mM sodium chloride) was then mixed with the 2 µl of Topoisomerase I. The sequence of the 5' to 3' strand of the duplex oligonucleotide is set forth in SEQ ID NO:1, and the sequence of the 3' to 5' strand of the duplex oligonucleotide is set forth in SEQ ID NO:2. 3 µl of crystallization solution were then added to the topoisomerase-oligonucleotide mixture. The crystallization chambers were sealed with Crystal Clear tape, and the plates were maintained at 20° C. Crystals formed within three to five days.

The topoisomerase-oligonucleotide complex crystallized in solution number 25 of Crystallization Solution Set III, and in solution number 32 of Crystallization Solution Set IV.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A set of crystallization solutions comprising a set selected from the group of sets consisting of Crystallization Solution Set I, Crystallization Solution Set II, Crystallization Solution Set III and Crystallization Solution Set IV.

2. A set of crystallization solutions of claim 1 comprising Crystallization Solution Set I.

3. A set of crystallization solutions of claim 2 consisting of Crystallization Solution Set I.

4. A set of crystallization solutions of claim 1 comprising Crystallization Solution Set II.

5. A set of crystallization solutions of claim 4 consisting of Crystallization Solution Set II.

6. A set of crystallization solutions of claim 1 comprising Crystallization Solution Set III.

7. A set of crystallization solutions of claim 6 consisting of Crystallization Solution Set III.

8. A set of crystallization solutions of claim 1 comprising Crystallization Solution Set IV.

9. A set of crystallization solutions of claim 8 consisting of Crystallization Solution Set IV.

10. A subset of crystallization solutions comprising a subset selected from the group of subsets consisting of solution numbers 1, 9, 10 and 28 of Crystallization Solution Set I, solution numbers 1, 8, 14, 26, 30 and 34 of Crystallization Solution Set II, solution numbers 2, 11, 18, 25, 26, 28, 29, 31, 38, 41 and 46 of Crystallization Solution Set III and solution numbers 2, 3, 5, 6, 7, 8, 17, 22, 24, 32, 34, 37, 43 and 48 of Crystallization Solution Set IV.

11. A subset of crystallization solutions of claim 10 comprising solution numbers 1, 9, 10 and 28 of Crystallization Solution Set I.

12. A subset of crystallization solutions of claim 10 comprising solution numbers 1, 8, 14, 26, 30 and 34 of Crystallization Solution Set II.

13. A subset of crystallization solutions of claim 10 comprising solution numbers 2, 11, 18, 25, 26, 28, 29, 31, 38, 41 and 46 of Crystallization Solution Set III.

14. A subset of crystallization solutions of claim 10 comprising solution numbers 2, 3, 5, 6, 7, 8, 17, 22, 24, 32, 34, 37, 43 and 48 of Crystallization Solution Set IV.

15. A kit comprising at least one crystallization plate and a set of crystallization solutions comprising a set selected from the group of sets consisting of Crystallization Solution Set I, Crystallization Solution Set II, Crystallization Solution Set III and Crystallization Solution Set IV.

16. The kit of claim 15 wherein the set of crystallization solutions comprises Crystallization Solution Set I.

17. The kit of claim 15 wherein the set of crystallization solutions comprises Crystallization Solution Set II.

18. The kit of claim 15 wherein the set of crystallization solutions comprises Crystallization Solution Set III.

19. The kit of claim 15 wherein the set of crystallization solutions comprises Crystallization Solution Set IV.

20. A kit comprising at least one crystallization plate and a subset of crystallization solutions comprising a subset selected from the group of subsets consisting of solution numbers 1, 9, 10 and 28 of Crystallization Solution Set I, solution numbers 1, 8, 14, 26, 30 and 34 of Crystallization Solution Set II, solution numbers 2, 11, 18, 25, 26, 28, 29, 31, 38, 41 and 46 of Crystallization Solution Set III and solution numbers 2, 3, 5, 6, 7, 8, 17, 22, 24, 32, 34, 37, 43 and 48 of Crystallization Solution Set IV.

21. The kit of claim 20 wherein the subset of crystallization solutions comprises solution numbers 1, 9, 10 and 28 of Crystallization Solution Set I.

22. The kit of claim 20 wherein the subset of crystallization solutions comprises solution numbers 1, 8, 14, 26, 30 and 34 of Crystallization Solution Set II.

23. The kit of claim 20 wherein the subset of crystallization solutions comprises solution numbers 2, 11, 18, 25, 26, 28, 29, 31, 38, 41 and 46 of Crystallization Solution Set III.

24. The kit of claim 20 wherein the subset of crystallization solutions comprises solution numbers 2, 3, 5, 6, 7, 8, 17, 22, 24, 32, 34, 37, 43 and 48 of Crystallization Solution Set IV.

* * * * *